(12) United States Patent
Schwab et al.

(10) Patent No.: US 8,189,194 B2
(45) Date of Patent: May 29, 2012

(54) DIRECT ILLUMINATION MACHINE VISION TECHNIQUE FOR PROCESSING SEMICONDUCTOR WAFERS

(75) Inventors: John W. Schwab, Framingham, MA (US); Gang Liu, Natick, MA (US); David J. Michael, Wayland, MA (US); Lei Wang, Shrewsbury, MA (US)

(73) Assignee: Cognex Corporation, Natick, MA (US)

( * ) Notice: Subject to any disclaimer, the term of this patent is extended or adjusted under 35 U.S.C. 154(b) by 494 days.

(21) Appl. No.: 12/209,248

(22) Filed: Sep. 12, 2008

(65) Prior Publication Data

US 2010/0065757 A1 Mar. 18, 2010

(51) Int. Cl.
*G01B 11/00* (2006.01)
(52) U.S. Cl. ............... 356/399; 356/401; 356/237.2; 356/237.5
(58) Field of Classification Search .......... 356/399, 356/237.2–237.5
See application file for complete search history.

(56) References Cited

U.S. PATENT DOCUMENTS

| | | | |
|---|---|---|---|
| 4,076,420 A | 2/1978 | De Maeyer et al. | |
| 4,238,780 A | 12/1980 | Doemens | |
| 4,391,505 A * | 7/1983 | Silverberg | 399/372 |
| 4,697,075 A | 9/1987 | Roos et al. | |
| 4,714,347 A | 12/1987 | Cole | |
| 4,803,735 A | 2/1989 | Nishida et al. | |
| 4,924,086 A | 5/1990 | Webber | |
| 4,969,037 A | 11/1990 | Poleschinski et al. | |
| 5,048,094 A | 9/1991 | Aoyama et al. | |
| 5,365,672 A | 11/1994 | Kato | |
| 5,367,439 A | 11/1994 | Mayer et al. | |
| 5,371,690 A | 12/1994 | Engel et al. | |
| 5,381,004 A | 10/1995 | Uritsky et al. | |
| 5,497,007 A | 3/1996 | Uritsky et al. | |
| 5,585,917 A | 12/1996 | Woite et al. | |
| 5,659,396 A * | 8/1997 | Mondie | 356/630 |
| 5,739,913 A | 4/1998 | Wallace | |
| 5,835,223 A * | 11/1998 | Zwemer et al. | 356/600 |
| 5,953,130 A | 9/1999 | Benedict et al. | |
| 5,978,081 A | 11/1999 | Michael et al. | |
| 5,982,132 A | 11/1999 | Colby | |
| 6,025,905 A | 2/2000 | Sussman | |
| 6,166,808 A * | 12/2000 | Greve | 356/601 |
| 6,170,973 B1 | 1/2001 | Benedict | |
| 6,191,850 B1 | 2/2001 | Chiang | |
| 6,275,742 B1 | 8/2001 | Sagues et al. | |
| 6,341,878 B1 | 1/2002 | Chiang | |
| 6,900,877 B2 | 5/2005 | Raaijmakers | |
| 6,914,679 B2 | 7/2005 | Nettekoven et al. | |
| 6,933,172 B2 | 8/2005 | Tomimatsu | |
| 7,042,568 B2 | 5/2006 | Mayo | |
| 7,048,400 B2 | 5/2006 | Murasko et al. | |
| 7,106,425 B1 | 9/2006 | Bultman et al. | |
| 7,119,908 B2 | 10/2006 | Nomoto et al. | |
| 7,225,734 B2 | 6/2007 | Schanz | |

(Continued)

*Primary Examiner* — Tarifur Chowdhury
*Assistant Examiner* — Isiaka Akanbi
(74) *Attorney, Agent, or Firm* — Quarles & Brady LLP

(57) ABSTRACT

A vision system is provided to determine a positional relationship between a semiconductor wafer on a platen and an element on a processing machine, such as a printing screen, on a remote side of the semiconductor wafer from the platen. A source directs ultraviolet light through an aperture in the platen to illuminate the semiconductor wafer and cast a shadow onto the element adjacent an edge of the semiconductor wafer. A video camera produces an image using light received from the platen aperture, wherein some of that received light was reflected by the wafer. The edge of the semiconductor wafer in the image is well defined by a dark/light transition.

20 Claims, 1 Drawing Sheet

U.S. PATENT DOCUMENTS

| | | |
|---|---|---|
| 7,295,314 B1 | 11/2007 | Spady et al. |
| 2005/0166772 A1 | 8/2005 | Schanz |
| 2006/0194123 A1* | 8/2006 | Mickan et al. .................... 430/5 |
| 2009/0274361 A1* | 11/2009 | Schwab et al. ................ 382/145 |

* cited by examiner

DIRECT ILLUMINATION MACHINE VISION TECHNIQUE FOR PROCESSING SEMICONDUCTOR WAFERS

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

The present invention relates to processes and equipment for manufacturing semiconductors, such as photovoltaic devices; and more particularly to apparatus and methods for aligning a component of the manufacturing equipment with a wafer of material on which the semiconductors are being fabricated.

2. Description of the Related Art

Semiconductor devices, such as solar cells are fabricated on a wafer of silicon or other material. Various sections of the wafer are electrically interconnected by a pattern of silver or other conductive material deposited on a surface of the wafer. Typically, a screen printing process, similar to silk screen printing element, is employed to deposit the silver in the proper pattern on the wafer surface. The printing screen used in that deposition process must be precisely aligned with the wafer in order that the silver conductive pattern is properly registered with the semiconductor devices.

Machine vision systems are commonly used in semiconductor device processing. In such systems, a video camera produces an image of the semiconductor wafer and that image is then analyzed for various purposes, such as defect detection. In other situations, the wafer image is utilized to determine whether the wafer is properly positioned on a work surface of a processing apparatus.

Difficulty has been encountered when attempting to utilize conventional machine vision systems to align the printing screen used to deposit the conductive pattern on a photocell wafer. Conventional illumination techniques did not provide sufficient contrast between the wafer and the printing screen to enable the vision system to reliably and accurately detect the edges of the wafer. Both the printing screen and the wafer reflect visible light similarly, which adversely affected the ability to distinguish between those objects. An alternative proposal involved backlighting the printing screen, however placing a light source on the remote side of the printing screen from the wafer interfered with the printing process.

As a consequence, it is desirable to develop an alternative technique for illuminating semiconductor wafers during use of a machine vision system.

SUMMARY OF THE INVENTION

A vision system is provided to determine a positional relationship between a semiconductor wafer on a platen and an element on a processing machine, such as a printing screen, on a remote side of the wafer from the platen. An aperture extends through the platen underneath an edge of the semiconductor wafer. A source directs a semiconductor wafer. The light beam at that angle results in the semiconductor wafer casting a shadow onto the element adjacent the edge of that wafer.

A video camera, positioned beneath the platen, produces an image using light received from the aperture, wherein some of that light was reflected by the wafer. The relatively dark shadow adjacent the brightly illuminated semiconductor wafer provides a well-defined dark/light transition in the camera image that enables the wafer edge to be readily observed and detected.

In a preferred embodiment of the vision system, the source produces ultraviolet light. A filter is located between the semiconductor wafer and the camera to transmit the ultraviolet light while blocking ambient light from reaching the camera.

DETAILED DESCRIPTION OF THE INVENTION

Although the present invention has particular application for use with equipment for processing photovoltaic device wafers, the vision system has applicability for use in fabricating other types of semiconductor wafers and devices. Furthermore, while the present vision system is being described in the context of an apparatus for printing conductive material on a semiconductor wafer, it can be employed with other kinds of equipment.

Figure 1:
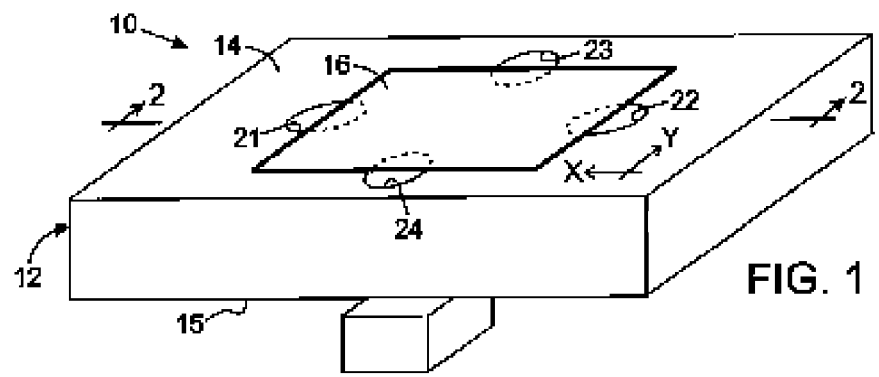
FIG. 1 is an isometric view of part of a printing apparatus showing a platen with a semiconductor wafer thereon.

With initial reference to FIG. 1, an apparatus 10 is employed to apply a conductive pattern of silver to a wafer on semiconductive material in which a photovoltaic device is being fabricated. The apparatus 10 has a platen 12 with a top surface 14 on which the semiconductor wafer 16 is positioned. The exemplary wafer 16 is rectangular, although the present technique can be used with wafers of other shapes by modifying the machine vision system to accommodate such shapes. Four circular viewing apertures 21, 22, 23, and 24 extend through the platen 12 between the opposite top and bottom surfaces 14 and 15. The viewing apertures 21-24 are located so that when the semiconductor wafer 16 is centrally positioned on the top surface 14, edges of the wafer bisect an opening of each viewing aperture 21-24. However, during the fabrication operation, the semiconductor wafer 16 does not have to be positioned to precisely bisect each aperture opening, but can be offset on the top surface along either or both of the X and Y orthogonal axes. A rotational offset also may occur. It should be understood that the number, size and positions of the viewing apertures 21-24 as illustrated can be varied within the scope of this invention.

Figure 2:
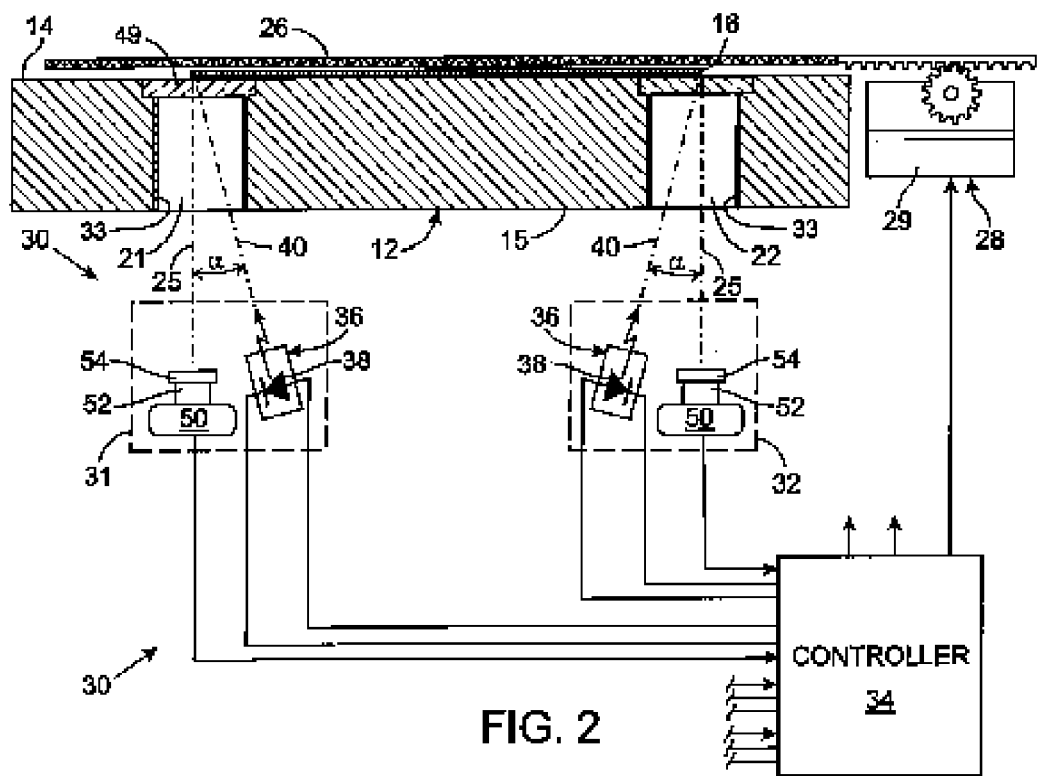
FIG. 2 is a cross sectional view along line 2-2 in FIG. 1 illustrating a machine vision system incorporated with the printing element printing apparatus.

As shown in FIG. 2, after the semiconductor wafer 16 is placed on the top surface 14 of the platen 12, a printing element 26 is positioned against the major surface of the semiconductor wafer 16 that is remote from the platen 12. The printing element 26 is of a type that has been used in previous processes to apply material in a pattern on a wafer surface and include, but are not limited to, a printing screen, a stencil, a lithographic mask, and an ink jet head. Nor is the present invention limited to equipment for depositing conductive material on a wafer. The location of the printing element 26 along the X and Y axes, as shown in FIG. 1, is controlled by a positioning mechanism 28 that employs two separate actuators 29 for independently moving the printing element along each axis. A third actuator may be provided to rotate the printing element with respect to the wafer. Only one of those actuators 29 is visible in FIG. 2 and is schematically represented as a motor that drives a rack and pinion mechanism, however, any conventional mechanism for positioning the printing element can be employed.

The positioning mechanism 28 is controlled by a machine vision system 30 that utilizes four camera modules, one located beneath each viewing aperture 21-24 in the platen 12. The camera modules 31 and 32 associated with the first and second viewing apertures 21 and 22 are illustrated in FIG. 2 and the first one 31 will be described in detail, with the understanding that the same description applies to the other three camera modules. Each camera module is connected to a conventional machine vision controller 34, which analyzes images received from the four camera modules to determine the position of the printing element 26 with respect to the semiconductor wafer 16.

The first camera module 31 is located beneath the first viewing aperture 21 in the platen 12 and includes a light source 36. The interior surfaces of the first and the other viewing apertures is coated with a layer 33 of anti-reflective material. The light source 36 has a light emitting diode (LED) 38, although other types of light emitters can be used. It is preferred that the LED 38 emits ultraviolet light which has a wavelength that is less than 410 nm, preferably in the 365-410 nm range, and in particular 365 nm or 380 nm. Although ultraviolet light provides greater contrast between the semiconductor wafer 16 and the printing element 26, other wavelengths can be utilized. The light source 36 produces a highly collimated light beam 40 that is directed through the first viewing aperture 21 and a window 49 at angle toward the semiconductor wafer 16 and the printing element 26. Specifically, the highly collimated light beam 40 is directed along a path at an acute angle $\alpha$, e.g., 18°, to a line that is perpendicular to the bottom surface of the semiconductor wafer 16, however other angles may be employed.

Figure 3:
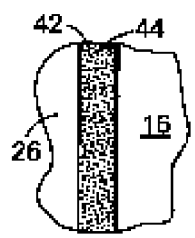
FIG. 3 illustrates a portion of an edge of the semiconductor wafer and the adjacent area.

With reference to FIG. 3, directing the light beam 40 at angle $\alpha$ casts a shadow of the semiconductor wafer 16 onto the printing element 26 adjacent the edge 44 of that wafer. The relatively dark shadow next to the brightly illuminated semiconductor wafer 16 provides significant light/dark illumination contrast at the wafer's edge 44. Some semiconductor wafer, especially those used for photovoltaic devices are very light absorbing and creating a shadow allows use of a very intense light source to brightly illuminate the wafer and overcome the light absorption.

Referring again to FIG. 2, the first camera module 31 also includes a conventional charge coupled device or a CMOS camera 50, that has sensitivity to the ultraviolet light used. The camera 50 has a lens 52 aimed upward through the first viewing aperture 21 and thus at the bottom surface of the semiconductor wafer 16. A narrow band-pass filter 54 is located between the lens 52 and the semiconductor wafer 16. The pass-band of the filter 54 includes the wavelength of the ultraviolet light from the source 36, but excludes ambient light wavelengths. Specifically, the band-pass filter 54 blocks visible light in the environment of the semiconductor processing apparatus 10 from entering the camera 50. Thus the camera 50 only receives ultraviolet light and primarily that light which is produced by source 36.

During fabrication of a semiconductor wafer, the semiconductor wafer 16 is placed onto the top surface 14 of the platen 12. The controller 34 then activates the light sources 36 in the four camera modules 31 associated with the viewing apertures 21-24 in the platen. Alternatively, the light sources 36 can be supplied with electricity via a manual switch, that is not operated by the controller 34. Operation of one camera module 31 will be described with the understanding that the same operation occurs in the other three camera modules 31.

The activation causes the light emitting diode 38 to emit the collimated ultraviolet light beam 40 which passes through the associated viewing aperture 21 and onto portions of the bottom surfaces of the semiconductor wafer 16 and the printing element 26 that extend over the viewing aperture 21. Thus areas of the semiconductor wafer 16 and the printing element 26 are brightly illuminated. As noted above, the angle $\alpha$ at which the light beam 40 is directed casts a shadow onto the printing element 26 which highlights the edge of the wafer 16 due to the light/dark contrast. This makes the edge more distinguishable in the image produced by the camera 50 than if the light was directed perpendicular to the bottom surface of the semiconductor wafer 16.

Portions of the lower surface of the printing element adjacent the edge of the semiconductor wafer 16 contain one or more fiducial marks that have a distinctive design and recognizable orientation. Those portions of the printing element are not used for printing a conductive pattern on the wafer. These fiducial marks in the camera's image indicate the positional relationship of the printing element 26 with respect to the edge of the semiconductor wafer 16.

The ultraviolet light that is reflected back into the viewing aperture 21 by either the printing element 26 or the semiconductor wafer 16 travels downward into the camera 50. Specifically the reflected light traveling from the viewing aperture 21 is transmitted by the narrow band-pass filter 54 which also has a coating that is anti-reflective to the ultraviolet wavelengths produced by the light source 36.

The ultraviolet light entering the camera 50 enables that device to produce an image of the wafer and the adjacent portion of the printing element 26. That image is conveyed to the controller 34 along with the images from the other three camera modules 31 associated with the other viewing apertures 22-24 in the platen 12. The controller 34 then employs conventional machine vision techniques to determine the positions of the semiconductor wafer 16 and the printing element 26 relative to each viewing aperture 21-24 and uses those collective positions to determine the orientation of the printing element 26 with respect to the semiconductor wafer 16. The controller 34 then activates the positioning mechanism 28 to move the printing element 26 along the X and Y axes as necessary to properly position the printing element over the semiconductor wafer 16 in order to print a conductive pattern that is properly registered with the photovoltaic devices. In addition, the relative position of the edges of the semiconductor wafer in the images from two cameras on opposite sides of that wafer and the spacing between the cameras can be used to determine the size of the wafer.

The foregoing description was primarily directed to a preferred embodiment of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

The invention claimed is:

1. A vision system for determining a positional relationship between a semiconductor wafer and an element for processing the semiconductor wafer, wherein the semiconductor wafer is on a platen that has an aperture there through and the element is located on a remote side of the semiconductor wafer from the platen, said vision system comprising:
- a source for directing light through the aperture in the platen to illuminate the semiconductor wafer to cast a shadow, onto the element, adjacent an edge of the semiconductor wafer; wherein walls of the aperture in the platen have an anti-reflective material thereon; and
- a camera for producing electrically an image from light received from the aperture it the platen, wherein at least some of that received light was reflected by the semiconductor wafer.

2. The vision system as recited in claim 1 wherein the source produces a light beam which is directed at an acute angle to a line that is perpendicular to a surface of the semiconductor wafer.

3. The vision system as recited in claim 1 wherein the source produces a collimated light beam.

4. The vision system as recited in claim 1 wherein the source produces ultraviolet light having a wavelength less than 410 nm.

5. The vision system as recited in claim 1 wherein the source produces ultraviolet light having a wavelength between 365 nm and 410 nm.

6. The vision system as recited in claim 1 wherein the source produces ultraviolet light.

7. The vision system as recited in claim 6 further comprising a filter located between the semiconductor wafer and the camera, wherein the filter is transparent to the ultraviolet light.

8. The vision system as recited in claim 6 further comprising a window of material that is transparent to the ultraviolet light and that is located in the aperture in the platen.

9. A vision system for determining a positional relationship between a semiconductor wafer and an element for processing the semiconductor wafer, wherein the semiconductor wafer is on a platen that has an aperture there through and the element is located on a remote side of the semiconductor wafer from the platen, said vision system comprising:
- a source which emits a light beam that is directed at an acute angle to a line that is perpendicular to a surface of the semiconductor wafer, thereby illuminating the semiconductor wafer to cast a shadow, onto the element, adjacent an edge of the semiconductor wafer; and
- a camera for producing electrically an image from light received from the aperture in the platen, wherein the edge of the semiconductor wafer is defined in the image by a dark/light transition.

10. The vision system as recited in claim 9 wherein the ultraviolet light has a wavelength less than 410 nm.

11. The vision system as recited in claim 9 wherein the ultraviolet light has a wavelength between 365 nm and 410 nm.

12. The vision system as recited in claim 9 wherein walls of the aperture in the platen have an anti-reflective material thereon.

13. The vision system as recited in claim 9 further comprising a filter located between the platen and the camera, wherein the filter is transparent to the ultraviolet light.

14. The vision system as recited in claim 9 wherein the source produces a collimated light beam.

15. A method for determining a positional relationship between a semiconductor wafer on a platen and an element for processing the semiconductor wafer that is on a remote side of the semiconductor wafer from the platen, said method comprising:
- emitting light from a source;
- directing the light through an aperture in the platen to illuminate the semiconductor wafer, wherein the light is directed at an acute angle to a line that is perpendicular to a surface of the semiconductor wafer, thereby illuminating the wafer to cast a shadow, onto the element, adjacent an edge of the semiconductor wafer; and
- employing a camera to produce electrically an image from light received from the aperture in the platen, wherein at least some of that received light was reflected by the semiconductor wafer.

16. The method as recited in claim 15 wherein the source produces ultraviolet light.

17. The method as recited in claim 16 wherein the ultraviolet light has a wavelength between 365 nm and 410 nm.

18. The method as recited in claim 16 further comprising providing a filter which block non-ultraviolet light from entering the camera.

19. The method as recited in claim 15 further comprising covering walls of the aperture in the platen with an anti-reflective material.

20. The method as recited in claim 15 wherein emitting light from a source comprises producing a collimated light beam.

* * * * *